(12) United States Patent
Oomori et al.

(10) Patent No.: US 9,728,422 B2
(45) Date of Patent: Aug. 8, 2017

(54) DRY ETCHING METHOD

(71) Applicant: Central Glass Company, Limited, Ube-shi, Yamaguchi (JP)

(72) Inventors: Hiroyuki Oomori, Ube (JP); Akiou Kikuchi, Ube (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 15/003,270

(22) Filed: Jan. 21, 2016

(65) Prior Publication Data

US 2016/0218015 A1 Jul. 28, 2016

(30) Foreign Application Priority Data

Jan. 23, 2015 (JP) .................... 2015-011725
Nov. 19, 2015 (JP) .................... 2015-226219

(51) Int. Cl.
*H01L 21/311* (2006.01)
*H01L 21/3213* (2006.01)

(52) U.S. Cl.
CPC .. *H01L 21/31116* (2013.01); *H01L 21/32137* (2013.01)

(58) Field of Classification Search
CPC .................... H01L 21/31116; H01L 21/32137
See application file for complete search history.

(56) References Cited

U.S. PATENT DOCUMENTS

| 6,183,655 | B1 | 2/2001 | Wang et al. |
| 6,387,287 | B1 | 5/2002 | Hung et al. |
| 2003/0045114 | A1* | 3/2003 | Ni .............. H01L 21/31116 438/710 |

(Continued)

FOREIGN PATENT DOCUMENTS

| JP | 2001-517868 A | 10/2001 |
| JP | 2012-114402 A | 6/2002 |

(Continued)

OTHER PUBLICATIONS

Hideaki et al., "BiCS Flash Memory for Realization of Ultrahigh-Density Nonvolatile Storage Devices", Toshiba Review, 2011, pp. 16-19, vol. 66, No. 9, with English abstract.

(Continued)

*Primary Examiner* — Nadine Norton
*Assistant Examiner* — Mahmoud Dahimene
(74) *Attorney, Agent, or Firm* — Crowell & Moring LLP (57) ABSTRACT

Disclosed is a dry etching method for a laminated film in which at least one silicon layer and at least one silicon oxide layer are laminated together. The dry etching method includes generating a plasma gas from a dry etching agent and etching the laminated film with the plasma gas under the application of a bias voltage. The dry etching agent contains an unsaturated hydrofluorocarbon represented by the following formula: $C_3H_xF_y$, where x is an integer of 1 to 5; y is an integer of 1 to 5; and x and y satisfy a relationship of $x+y=4$ or 6, and iodine heptafluoride. The volume of the iodine heptafluoride in the dry etching agent is 0.1 to 1.0 times the volume of the unsaturated hydrofluorocarbon in the dry etching agent.

10 Claims, 3 Drawing Sheets

(56) References Cited

U.S. PATENT DOCUMENTS

| | | |
|---|---|---|
| 2005/0045276 A1 | 3/2005 | Patel et al. |
| 2005/0266691 A1 | 12/2005 | Gu et al. |
| 2013/0105728 A1 | 5/2013 | Umezaki et al. |
| 2014/0199852 A1* | 7/2014 | Kimura .............. H01L 21/32135 438/738 |
| 2014/0206196 A1 | 7/2014 | Umezaki et al. |
| 2014/0302683 A1 | 10/2014 | Kikuchi et al. |

FOREIGN PATENT DOCUMENTS

| | | |
|---|---|---|
| JP | 2002-530863 A | 9/2002 |
| JP | 2007-537602 A | 12/2007 |
| JP | 2008-16479 A | 1/2008 |
| JP | 2008-177209 A | 7/2008 |
| JP | 2011-176291 A | 9/2011 |
| JP | 2013-30531 A | 2/2013 |
| JP | 2013-70012 A | 4/2013 |
| KR | 10-2013-0036320 A | 4/2013 |
| TW | 201217500 A1 | 5/2012 |
| TW | 201313878 A1 | 4/2013 |

OTHER PUBLICATIONS

Takashi et al., "Topography Simulation Technology for BiCS Ultra-high-Density Flash Memory", Toshiba Review, 2011, pp. 29-33, vol. 66, No. 5, with English abstract.

Korean-language Office Action issued in counterpart Korean Application No. 10-2016-0008340 dated Dec. 19, 2016 (Five (5) pages).

* cited by examiner

DRY ETCHING METHOD

FIELD OF THE INVENTION

The present invention relates to a dry etching method using an unsaturated hydrofluorocarbon-containing dry etching agent.

BACKGROUND OF THE INVENTION

In the field of semiconductor manufacturing, fine processing is nowadays close to physical limits. As a solution to overcome such physical limits, it has been proposed to realize high integration of semiconductor devices, in particular NAND flash memories, by stacking device components in height directions. The research and development of three-dimensional NAND flash memories etc. are being actively pursued using the proposed high-integration techniques.

Figure 1:
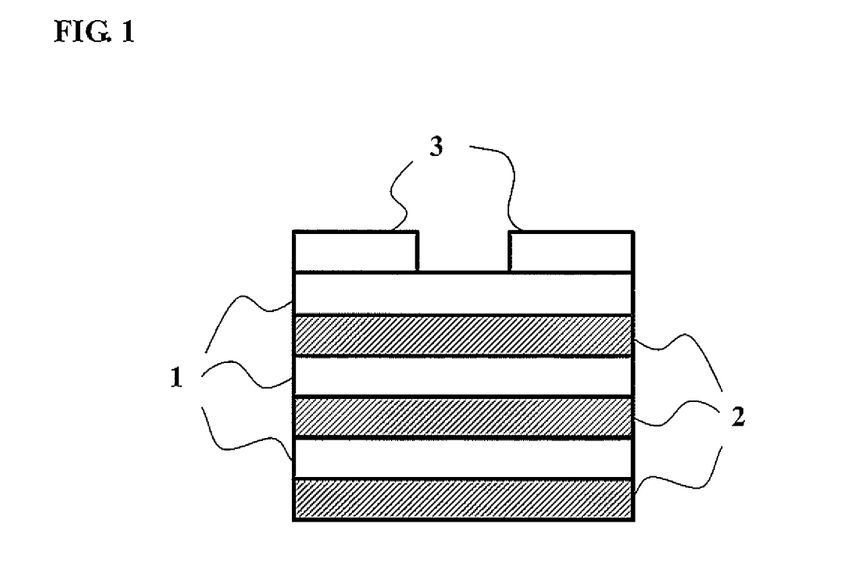
FIG. 1 is a schematic view showing the laminated structure of a device element before the formation of a through hole by etching operation.

One such type of three-dimensional NAND flash memory is disclosed in e.g. Toshiba Review, Vol. 66, No. 9, pages 16-19 (2011) (hereinafter referred to as "Non-Patent Document 1"). For manufacturing of this three-dimensional NAND flash memory, a laminated film is first formed as a charge holding part by alternately laminating a plurality of layers 1 of polycrystal silicon (abbreviated as "poly-Si" or "p-Si") and a plurality of layers 2 of silicon oxide (abbreviated as "$SiO_x$") on a substrate as shown in FIG. 1. Next, through holes are formed by etching in the laminated film for embedding of interconnection between independent memory cells. More specifically, the etching is performed by applying a resist mask 3 with predetermined openings to the outmost layer of the laminated film and removing p-Si and $SiO_x$ upon contact with a plasma of fluorine-containing gas through the openings of the resist mask 3 in a chamber. Herein, the direction of collision of ions in the plasma is controlled with the application of a direct-current voltage, called "bias voltage", between upper and lower electrodes in the chamber such that the laminated film is anisotropically etched in its height direction perpendicular to the in-plane direction (film surface direction). Although the bias voltage corresponds to a potential difference naturally occurring between the upper and lower electrodes due to the difference in migration speed between the ions and electrons in the plasma, the bias voltage can be adjusted with the supply of alternating-current power from an external source.

However, the preferable etching conditions of p-Si and $SiO_x$ differ from each other. In view of these different p-Si and $SiO_x$ etching conditions, it has been proposed in Toshiba Review, Vol. 66, No. 5, pages 29-33 (2011) (hereinafter referred to as "Non-Patent Document 2") to form the through holes in the p-Si/$SiO_x$ laminated film by alternately and independently repeating p-Si etching operation and $SiO_x$ etching operation.

Figure 2:
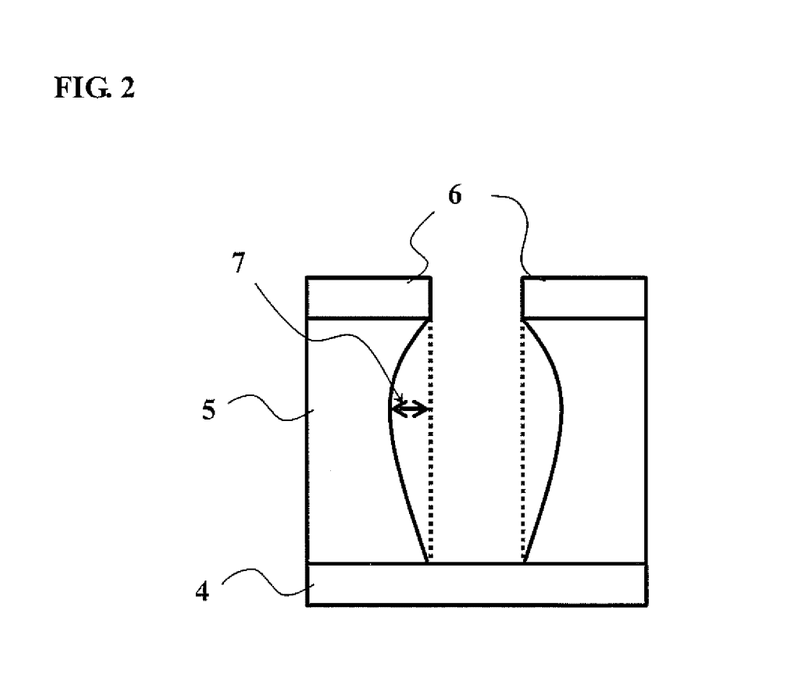
FIG. 2 is a schematic view showing the occurrence of side etching during etching operation.

Further, there are widely used saturated fluorocarbons such as $CF_4$, $C_2F_6$ and $C_3F_8$ as fluorine-containing etching gas components as disclosed in Japanese Translation of PCT International Application Publication No. JP-T-2007-537602 (hereinafter referred to as "Patent Document 1"). The use of such a saturated fluorocarbon however often results in the occurrence of etching in an undesired direction, called "side etching". In the case of forming a through hole in a target layer 5 by etching through a mask 6 as shown in FIG. 2, for example, the etching of the target layer 5 may proceed in not only a vertical direction but also a horizontal direction so that the through hole becomes wider in diameter than the opening pattern of the mask 6 due to side etching 7.

Furthermore, Japanese Translation of PCT International Application Publication No. JP-T-2001-517868 (hereinafter referred to as "Patent Document 2") discloses a plasma etching method for etching silicon oxide selectively over silicon nitride with the use of hexafluoropropylene ($C_3F_6$), octafluoropropane ($C_3F_8$), heptafluoropropane ($C_3HF_7$) or hexafluoropropane ($C_3H_2F_6$).

Japanese Translation of PCT International Application Publication No. JP-T-2002-530863 (hereinafter referred to as "Patent Document 3") discloses a plasma etching method for selectively etching a silicon oxide layer on a silicon nitride layer with the use of hexafluorobutadiene, hexafluorocyclobutene or hexafluorobenzene.

Japanese Laid-Open Patent Publication No. 2013-70012 (hereinafter referred to as "Patent Document 4") discloses a dry etching method for a laminated film in which silicon layers and silicon oxide films are laminated together and, more specifically, for etching parts of the silicon layers appearing on an inner side surface of a hole or groove of the laminated film with the combined use of a fluorinated halogen compound gas and a fluorine gas.

On the other hand, Japanese Laid-Open Patent Publication No. 2011-176291, No. 2012-114402 and No. 2013-30531 (hereinafter referred to as "Patent Documents 5, 6 and 7", respectively) disclose that the use of an unsaturated hydrofluorocarbon such as $C_3H_2F_4$ or $C_3HF_3$ as an etching agent makes it possible to prevent the occurrence of side etching.

Japanese Laid-Open Patent Publication No. 2008-177209 (hereinafter referred to as "Patent Document 8") discloses a plasma etching method for anisotropically etching a silicon substrate with the use of an etching gas containing iodine fluoride.

SUMMARY OF THE INVENTION

As mentioned above, it has been proposed in Non-Patent Document 2 to form the through hole in the p-Si/$SiO_x$ laminated film by alternately and independently repeating p-Si etching operation and $SiO_x$ etching operation. In this etching process, however, it is necessary to switch over the etching conditions for the respective independent p-Si and $SiO_x$ etching operations. Thus, the etching process of Non-Patent Document 2 is time-consuming and presents the problem that the time for formation of the through hole in the p-Si/$SiO_x$ laminated film increases with increase in the number of the p-Si and $SiO_x$ layers in the laminated film (i.e. the time for production of the memory cells increases with the number of lamination of the memory cells). In view of the throughput, which is directly correlated with device manufacturing cost, it is desirable to shorten the time of the etching process.

The etching process of Non-Patent Document 2 also presents the problem of bumps and depressions on a side wall (inner surface) of the through hole, or decrease of diameter in a lower part of the through hole, due to the difference in etching rate between p-Si and $SiO_x$. This problem results from the respective independent p-Si and $SiO_x$ etching operations. For example, the etching of p-Si should be completely suppressed during the $SiO_x$ etching operation. In fact, however, the etching of p-Si slightly proceeds during the $SiO_x$ etching operation. Even when a passivation film is formed on the side wall during the p-Si etching operation so as to suppress the occurrence of side etching, the passivation film is removed during the $SiO_x$ etching operation. With the progress of the etching process, the diameter of the through hole becomes wider as closer to the film surface. Further, the bumps and depressions on the side wall of the through hole become more pronounced with the progress of the etching process. The occurrence of such bumps and depressions on the side wall of the through hole or such unevenness in the diameter of the through hole becomes a cause of deterioration in memory cell performance.

By setting the etching rate of p-Si and the etching rate of $SiO_x$ to equal levels, the p-Si and $SiO_x$ etching operations can be combined into one so that it is possible to form the though hole in the p-Si/$SiO_x$ laminated film in one etching operation. In this one etching operation, a uniform passivation film can be formed on the p-Si and $SiO_x$ layers so that it becomes possible to prevent the occurrence of side etching and reduce the bumps and depressions on the side wall of the through hole. For these reasons, there has been a demand to develop an etching method capable of etching the p-Si and $SiO_x$ layers in one etching operation so as to shorten the time required for formation of the through hole in the p-Si/$SiO_x$ laminated film and, at the same time, reduce the bumps and depressions on the side wall of the through hole and secure the uniform diameter of the through hole.

Each of Patent Documents 2 and 3 discloses the method for selective etching of silicon oxide over silicon nitride, but makes no mention of the method for simultaneous etching of p-Si and $SiO_x$. Patent Document 4 discloses the method for etching the silicon layer after the formation of the through hole in the laminated film, but makes no specific mention of the method for forming the through hole in the laminated film. Each of Patent Documents 5 to 7 discloses the method for selective etching of SiN or $SiO_x$, but makes no mention of the method for equal-rate etching of p-Si and $SiO_x$.

It has been proposed to add $O_2$ for improvement of silicon etching selectivity. In this case, however, the amount of etching of the resist mask on the laminated film becomes increased so that the resist mask cannot perform its sufficient function for practical use.

Although $IF_7$ is recited as one kind of iodine fluoride in Patent Document 8, Patent Document 8 merely discloses some working examples using $IF_5$ and does not disclose any working examples using $IF_7$. Patent Document 8 does not also make any mention of the method for equal-rate etching of p-Si and $SiO_x$.

The present invention has been made in view of the above problems. It is accordingly an object of the present invention to provide a dry etching method for equal-rate (simultaneous) etching of p-Si and $SiO_x$.

As a result of extensive researches, the present inventors have found that it is possible to etch p-Si and $SiO_x$ at substantially equal rates by plasma etching using a dry etching agent containing an unsaturated $C_3$ hydrofluorocarbon and iodine heptafluoride. The present invention is based on this finding.

Namely, the present invention provides a dry etching method for a laminated film, the laminated film comprising at least one silicon layer and at least one silicon oxide layer laminated together, the dry etching method comprising: generating a plasma gas from a dry etching agent; and etching the laminated film with the plasma gas under the application of a bias voltage, wherein the dry etching agent comprises: an unsaturated hydrofluorocarbon represented by the following formula: $C_3H_xF_y$, where x is an integer of 1 to 5; y is an integer of 1 to 5; and x and y satisfy a relationship of x+y=4 or 6; and iodine heptafluoride; and wherein the volume of the iodine heptafluoride in the dry etching agent is 0.1 to 1.0 times the volume of the unsaturated hydrofluorocarbon in the dry etching agent.

It is preferable that the unsaturated hydrofluorocarbon is at least one selected from the group consisting of $C_3HF_5$, $C_3H_2F_4$ and $C_3HF_3$. It is further preferable that the bias voltage is 500 V or higher.

The dry etching method of the present invention enables equal-rate etching of p-Si and $SiO_x$. In the case where this dry etching method is used to form a through hole in a laminated film in which a plurality of p-Si layers and $SiO_x$ layers are alternately laminated together, p-Si and $SiO_x$ can be etched at equal rates so that it is possible to reduce bumps and depressions on a side wall (inner surface) of the through hole and suppress unevenness of hole diameter between upper and lower parts of the through hole.

DESCRIPTION OF EMBODIMENTS

The present invention will be described in detail below. It should be herein noted that: the present invention is not limited to the following embodiments; and various changes and modifications of the following embodiments can be made without departing from the scope of the present invention.

A dry etching method according to one embodiment of the present invention (hereinafter simply referred to as "present dry etching method") is for etching a laminated film in which at least one polycrystal silicon layer (p-Si layer) and at least one silicon oxide layer ($SiO_x$ layer) are laminated together on a substrate. More specifically, the present dry etching method is performed in a chamber by generating a plasma gas from a dry etching agent and etching the laminated film with the plasma gas under the application of a bias voltage, wherein the dry etching agent contains: an unsaturated hydrofluorocarbon represented by the following formula: $C_3H_xF_y$ where x is an integer of 1 to 5; y is an integer of 1 to 5; and x and y satisfy a relationship of x+y=4 or 6 (hereinafter referred to as "unsaturated hydrofluorocarbon $C_3H_xF_y$"); and iodine heptafluoride ($IF_7$); and wherein the volume of the iodine heptafluoride in the dry etching agent is 0.1 to 1.0 times the volume of the unsaturated hydrofluorocarbon in the dry etching agent. The present dry etching method is suitably used to form a through hole in the laminated film by etching the laminate film through a mask of photoresist etc.

Examples of the unsaturated hydrofluorocarbon $C_3H_xF_y$ are $C_3HF_5$, $C_3H_2F_4$, $C_3H_3F_3$, $C_3H_4F_2$, $C_3H_5F$, $C_3HF_3$, $C_3H_2F_2$ and $C_3H_3F$. These hydrocarbon compounds can be used solely or in the form of a mixture of two or more thereof. The larger the number of fluorine atoms in the unsaturated hydrofluorocarbon $C_3H_xF_y$, the higher the etching rate. Thus, $C_3HF_5$, $C_3H_2F_4$, $C_3H_3F_3$, $C_3HF_3$ and $C_3H_2F_2$ are preferred as the unsaturated hydrofluorocarbon $C_3H_xF_y$. It is particularly preferable to use, as the unsaturated hydrofluorocarbon $C_3H_xF_y$, least one selected from the group consisting of $C_3HF_5$, $C_3H_2F_4$ and $C_3HF_3$ because each of $C_3HF_5$, $C_3H_2F_4$ and $C_3HF_3$ has a $CF_3$ group bonded via a single bond to an unsaturated bond and allows high-frequency generation of $CF_3^+$ ions of high etching efficiency.

The unsaturated hydrofluorocarbon $C_3H_xF_y$ may exist as stereoisomers, i.e., trans isomer (E isomer) and cis isomer (Z isomer). In the present dry etching method, it is feasible to use either one of the trans and cis isomers or a mixture of the trans and cis isomers.

As $C_3HF_5$, there can be used any of trans-1,2,3,3,3-pentafluoropropene (HFO-1225ye(E)), cis-1,2,3,3,3-pentafluoropropene (HFO-1225ye(Z)) and 1,1,3,3,3-pentafluoropropene (HFO-1225zc). As $C_3H_2F_4$, there can be used any of 2,3,3,3-tetrafluoropropene (HFO-1234yf), trans-1,3,3,3-tetrafluoropropene (HFO-1234ze(E)) and cis-1,3,3,3-tetrafluoropropene (HFO-1234ze(Z)).

The unsaturated hydrofluorocarbon $C_3H_xF_y$ has a higher boiling point than those of unsaturated hydrofluorocarbons of 4 or more carbons and shows a high vapor pressure even at ordinary temperatures. In the case of the unsaturated hydrofluorocarbon of 4 or more carbons, there is a possibility of sudden decrease in process pressure as the temperature of liquefied hydrofluorocarbon gas in a cylinder becomes decreased due to latent heat of vaporization. This possibility is less likely in the case of the unsaturated hydrofluorocarbon $C_3H_xF_y$.

As the unsaturated hydrofluorocarbon $C_3H_xF_y$ has an unsaturated bond in the molecule, the unsaturated hydrofluorocarbon $C_3H_xF_y$ can be polymerized in the plasma and deposited to form a passivation film on a side wall (inner surface) of the through hole during the plasma etching. By the formation of such a passivation film, it is possible to prevent the occurrence of side etching in the present dry etching method. In the present dry etching method, both of the p-Si layer and $SiO_x$ layer are subjected to etching in one etching operation. Further, the above-formed passivation film remains during the plasma etching. It is thus possible to suppress the progress of side etching against both of the p-Si layer and the $SiO_x$ layer.

The unsaturated hydrofluorocarbon $C_3H_xF_y$ can be also decomposed into fragments such as not only a relatively large amount of unsaturated $C_2$ or $C_3$ hydrocarbon ions but also $CF_n^+$ ions (where n=1, 2 or 3) etc. during the plasma etching as the unsaturated hydrofluorocarbon $C_3H_xF_y$ has an unsaturated bond and a hydrogen atom in the molecule. As the unsaturated $C_2$ or $C_3$ hydrocarbon ions are readily adsorbed on the p-Si layer to form a passivation film, it is possible to suppress excessive etching of p-Si layer with $IF_7$. On the other hand, the $CF_n^+$ ions show high etching reactivity to $SiO_x$. Although the etching of $SiO_x$ hardly proceeds with the use of only $IF_7$, it is possible to etch the $SiO_x$ layer with these $CF_n^+$ ions. In the case of using a perfluorocarbon with no hydrogen atom, it is difficult to form a passivation film and thereby difficult to achieve equal-rate etching of p-Si and $SiO_x$ due to too high etching rate of p-Si even without the use of $IF_7$.

For sufficient etching rate, the concentration of the unsaturated hydrofluorocarbon $C_3H_xF_y$ in the dry etching agent is preferably in the range of 1 to 90 vol %. When the concentration of the unsaturated hydrofluorocarbon $C_3H_xF_y$ in the dry etching agent exceeds 90 vol %, the concentration of the iodine heptafluoride in the dry etching agent becomes insufficient to improve the etching rate. In view of the cost effectiveness, it is unfavorable to use the expensive unsaturated hydrofluorocarbon $C_3H_xF_y$ in such a large amount. The concentration of the unsaturated hydrofluorocarbon $C_3H_xF_y$ in the dry etching agent is more preferably in the range of 10 to 50 vol % in view of the actual cost effectiveness as well as the etching rate.

Moreover, the volume of the iodine heptafluoride in the dry etching agent is preferably 0.1 to 1.0 times the volume of the unsaturated hydrofluorocarbon $C_3H_xF_y$ in the dry etching agent. In other words, the mixing ratio of the unsaturated hydrofluorocarbon $C_3H_xF_y$ and the iodine heptafluoride is preferably 1:0.1 to 1:1 in terms of volume ratio. The mixing ratio of the unsaturated hydrofluorocarbon $C_3H_xF_y$ and the iodine heptafluoride is more preferably 1:0.2 to 1:0.6, still more preferably 1:0.3 to 1:0.5, in terms of volume ratio. When the mixing ratio of the unsaturated hydrofluorocarbon $C_3H_xF_y$ and the iodine heptafluoride is in the above range, it is possible to achieve equal-rate etching of p-Si and $SiO_x$. In the present dry etching method, the difference between the etching rate of p-Si and the etching rate of $SiO_x$ can be controlled to within ±50%, i.e., the ratio between the etching rate of p-Si and the etching rate of $SiO_x$ can be controlled to within 67 to 150%. It is particularly preferable to control the ratio between the etching rate of p-Si and the etching rate of $SiO_x$ to within 80 to 120%.

The iodine heptafluoride performs an etching function against p-Si and, at the same time, serves as an oxidizing agent against the unsaturated hydrofluorocarbon $C_3H_xF_y$. When the iodine heptafluoride is used in an excessive amount, the etching rate of p-Si becomes too high as compared to the etching rate of $SiO_x$. When the amount of the iodine heptafluoride used is too small, the oxidization and decomposition of the unsaturated hydrofluorocarbon $C_3H_xF_y$ does not proceed sufficiently so that it becomes impossible to obtain adequate etching rate of p-Si and $SiO_x$.

The iodine heptafluoride has an iodine atom in its molecule. As the iodine serves as an adsorbent for excessive F content, it is possible to reduce damage to the resist mask. The iodine also serves to, when included in the passivation film deposited on the resist mask, increase the strength of the passivation film and improve the etching resistance of the resist mask. It is thus possible to obtain improvement in the etching selectivity of silicon over the resist mask. The iodine heptafluoride can be easily supplied in gaseous form as the boiling point of the iodine heptafluoride is about 5° C.

As an interhalogen compound of iodine and fluorine, iodine pentafluoride ($IF_5$) is also known. It is however time- and effort-consuming to supply the iodine pentafluoride in gaseous form as the boiling point of the iodine pentafluoride is about 98° C. Moreover, the iodine heptafluoride shows a higher etching selectivity of silicon over the resist mask than the iodine pentafluoride and allows sufficient oxidation and decomposition of the unsaturated hydrofluorocarbon $C_3H_xF_y$. In view of these facts, the iodine heptafluoride is preferred to the iodine pentafluoride in the present dry etching method.

In the present dry etching method, the etching rate of p-Si and the etching rate of $SiO_x$ are set to equal levels as explained above. It is therefore possible to etch the laminated film of the p-Si and $SiO_x$ layers in one etching operation. It is also possible to reduce bumps and depressions on the side wall (inner surface) of the through hole and secure the uniform diameter of the through hole without unevenness between upper and lower parts of the through hole.

Although the dry etching agent may consist essentially of the unsaturated hydrofluorocarbon $C_3H_xF_y$ and the iodine heptafluoride, it is preferable to add an inert gas to the dry etching agent for reduction of cost and for improvement of handling safety. Examples of the inert gas are: noble gases such as argon gas, helium gas, neon gas, krypton gas and xenon gas; and nitrogen gas. In particular, argon gas is preferred as the inert gas as it is possible to obtain higher etching rate by the synergistic effect of the combination of the argon gas with the unsaturated hydrofluorocarbon $C_3H_xF_y$, and the iodine heptafluoride. The total amount of the unsaturated hydrofluorocarbon $C_3H_xF_y$, and the iodine heptafluoride in the dry etching agent is preferably 2 to 95 vol %, more preferably 10 to 80 vol %, still more preferably 20 to 60 vol %. It is a preferred embodiment that the dry etching agent consists essentially of the unsaturated hydrofluorocarbon $C_3H_xF_y$, the iodine heptafluoride and the inert gas.

In order to improve the etching rate of p-Si and $SiO_x$, an oxidizing gas may be added to the dry etching agent. The oxidizing gas is preferably at least one selected from the group consisting of $O_2$, $O_3$, CO, $CO_2$, $COCl_2$, $COF_2$, $F_2$, $NF_3$, $Cl_2$, $Br_2$ and $I_2$. Further, a reducing gas may be added to the dry etching agent in order to reduce the amount of F radicals and suppress the occurrence of isotropic etching. The reducing gas is preferably at least one selected from the group consisting of $CH_4$, $C_2H_2$, $C_2H_4$, $C_2H_6$, $C_3H_4$, $C_3H_6$, $C_3H_8$, HF, HI, HBr, HCl, NO, $NH_3$ and $H_2$.

It is possible to anisotropically etch the laminated film and form the through hole with a high aspect ratio in the direction perpendicular to the in-plane direction of the laminated film by generating the plasma gas from the dry etching method and bringing the plasma gas into contact with the laminated film under the application of the bias voltage. The application of the bias voltage is particularly important to reduce the occurrence of side etching in the case where $IF_7$ is used as the oxidizing agent. The bias voltage is preferably 500 V or higher, more preferably 1000 V or higher. The higher the bias voltage, the less likely the side etching. It is however unfavorable to apply the bias voltage exceeding 10000 V because the amount of damage to the substrate wafer becomes large when the bias voltage exceeds 10000 V.

It is feasible to charge the dry etching agent into the chamber by introducing the respective etching gas components independently to the chamber or by mixing the respective etching gas components together and then introducing the resulting mixed gas to the chamber. The total amount of the dry etching gas introduced into the chamber can be set as appropriate in view of the concentration and pressure conditions inside the chamber according to the capacity and discharge ability of the chamber.

During the etching operation, the pressure inside the chamber is preferably set to 5 Pa or lower, more preferably 1 Pa or lower, for stable plasma generation and for suppression of side etching by increase of ion flow straightness. On the other hand, there occurs less ionization of the dry etching agent when the pressure inside the chamber is too low. The pressure inside the chamber is thus preferably set to 0.05 Pa or higher during the etching operation.

The temperature of the substrate during the etching operation is preferably set to 50° C. or lower. The substrate temperature is particularly preferably 20° C. or lower for anisotropic etching. When the etching operation is performed at a high temperature exceeding 50° C., the tendency of isotropic etching increases with decrease in the amount of the passivation film formed mainly from the fluorocarbon radicals on the side wall of the through hole so that it may not be possible to obtain a required level of processing accuracy. In addition, the mask material such as resist may be significantly etched under such high-temperature conditions.

In view of the device manufacturing efficiency, the etching time is preferably within 30 minutes. Herein, the etching time refers to the time of etching reaction of the laminated film by generation of the plasma gas from the dry etching agent in the chamber.

There is no particular limitation on the structure of the laminated film as long as at least one p-Si layer and at least one $SiO_x$ layer are laminated together. It is preferable that the laminated film has a plurality of p-Si layers and $SiO_x$ layers alternately laminated together. There are no particular limitations on the number of the p-Si and $SiO_x$ layers in the laminated film and on the depth of the through hole. In view of the integration effects by lamination of the p-Si and $SiO_x$ layers, it is preferable that: the total number of the p-Si and $SiO_x$ layers in the laminated film is 6 or more; and the depth of the though hole is 0.2 µm or more.

The present dry etching method can be performed by various etching techniques such as capacitively coupled plasma (CCP) etching, reactive ion etching (ME), inductively coupled plasma (ICP) etching, electron cyclotron resonance (ECR) plasma etching and microwave etching.

EXAMPLES

The present invention will be described in more detail below by way of the following examples and comparative examples. It should be understood that these examples are illustrative and are not intended to limit the present invention thereto.

Figure 3:
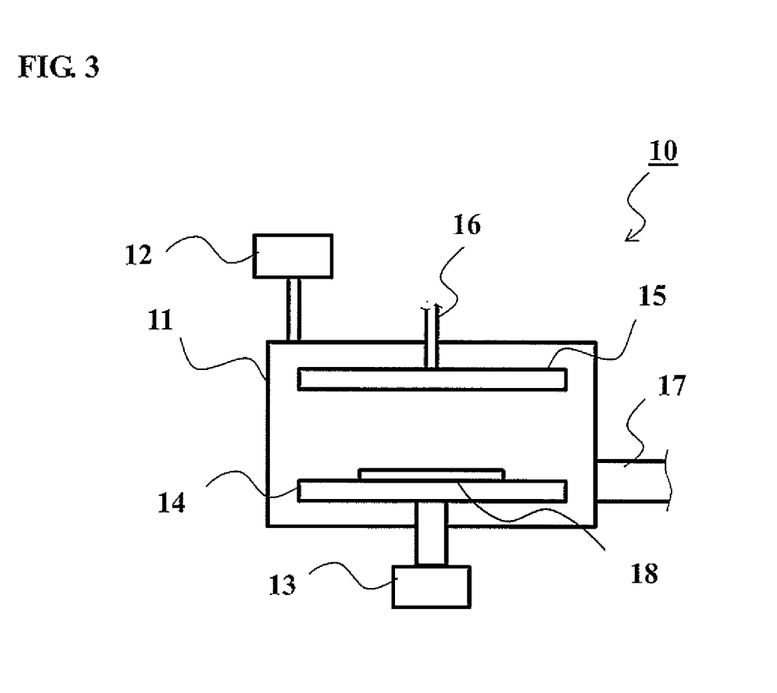
FIG. 3 is a schematic view showing a reaction device used in Examples and Comparative Examples.

In Examples 1 to 10 and Comparative Examples 1 to 6, etching operation was performed on a test sample 18 in a reaction device 10 as shown in FIG. 3.

The reaction device 10 had a chamber 11 in which lower and upper electrodes 14 and 15 are placed. The lower electrode 14 also served as a stage to hold the test sample 18 in the chamber 11. The chamber 11 was equipped with a pressure gauge 12 and a high-frequency power source (13.56 MHz) 13. Further, a gas introduction port 16 was connected to an upper part of the chamber 11. A dry etching agent was introduced in gaseous form into the chamber 11 though the gas introduction port 16 while the pressure inside the chamber 11 was controlled to a given degree. The introduced dry etching agent was excited to a plasma state by the high-frequency power source 13. The generated plasma gas was brought into contact with the test sample 18 on the lower electrode 14. With the supply of high-frequency power from the high-frequency power source 13, there was developed a direct-current voltage, called "bias voltage", between the lower and upper electrodes 14 and 15 due to the difference in migration speed between the ions and electrons in the plasma. After the etching operation, the gas was discharged out of the chamber 11 though a gas discharge line 17.

In each of Examples 1 to 10 and Comparative Examples 1 to 6, three types of silicon wafers A, B and C were used as the test sample 18. The silicon wafer A had a p-Si layer formed with a thickness of about 1 µm. The silicon wafer B had a $SiO_2$ layer formed with a thickness about 1 µm. The silicon wafer C had a p-Si layer formed with a thickness of about 1 µm and a resist mask applied to the p-Si layer. A circular opening of 1 µm diameter was made in the resist mask as a hole diameter ratio measurement pattern. Herein, both of the p-Si layers and the $SiO_2$ layer were formed by a CVD process.

Example 1

Etching Operation

The dry etching agent was prepared by mixing 10 vol % of $C_3HF_5$ (HFO-1225zc) as a fluorocarbon, 1 vol % of $IF_7$ as an additive gas and 89 vol % of Ar as an inert gas. In the etching operation, the dry etching gas was fed at 100 sccm to the chamber 11; and the pressure inside the chamber 11 was set to 1 Pa. The test sample 18 was subjected to etching by generating a plasma gas from the dry etching agent with the supply of 400 W of high-frequency power. The density of the high-frequency power supplied was 1.0 $W/cm^2$; and the bias voltage applied was 500V. As the respective gas components are substantially the same in molar volume (volume per 1 mol), the volume ratio of the gas components can be read as the mol ratio.

Performance Evaluation 1: Etching Rate Ratio

An etching rate ratio was evaluated by the following procedure to examine whether or not p-Si and $SiO_x$ were etched at equal rates.

The etching rate of p-Si was determined based on a difference in the thickness of the p-Si layer on the silicon wafer A before and after the etching operation. Similarly, the etching rate of $SiO_2$ was determined based on a difference in the thickness of the $SiO_2$ layer on the silicon wafer B before and after the etching operation. The etching rate ratio was calculated by the following equation.

$$\text{Etching rate ratio} = \frac{\text{Etching rate of } p\text{-Si layer}}{\text{Etching rate of } SiO_2 \text{ layer}} \times 100\%$$

It is preferable that the etching rate ratio is in the range of 67 to 150% because it is possible to effectively prevent the occurrence of bumps and depressions on the side wall of the through hole of the laminate film by controlling the etching rate ratio to within this range as mentioned above.

Performance Evaluation 2: Hole Diameter Ratio

A cross section of the silicon wafer C after the etching operation was observed with a scanning electron microscope to examine the shape of the hole formed in the p-Si layer during the etching operation. A hole diameter ratio was calculated by the following equation to evaluate the degree of unevenness in the diameter of the hole due to side etching.

$$\text{Hole diameter ratio} = \frac{\text{Diameter of hole in } p\text{-Si layer}}{\text{Diameter of opening in mask}} \times 100\%$$

It is preferable that the hole diameter ratio is 30% or lower at the maximum. The higher the hole diameter ratio, the more anisotropic the etching. The lower the hole diameter ratio, the more isotropic the etching.

Example 2

The etching operation was performed under the same conditions as in Example 1, except that the dry etching agent used contained 10 vol % of $C_3HF_5$ (HFO-1225zc) as the fluorocarbon, 2 vol % of $IF_7$ as the additive gas and 88 vol % of Ar as the inert gas. The etching performance was the evaluated in the same manner as in Example 1.

Example 3

The etching operation was performed under the same conditions as in Example 1, except that the dry etching agent used contained 10 vol % of $C_3H_2F_4$ (HFO-1234ze(E)) as the fluorocarbon, 2 vol % of $IF_7$ as the additive gas and 88 vol % of Ar as the inert gas. The etching performance was the evaluated in the same manner as in Example 1.

Example 4

The etching operation was performed under the same conditions as in Example 1, except that the dry etching agent used contained 10 vol % of $C_3H_2F_4$ (HFO-1234ze(E)) as the fluorocarbon, 3 vol % of $IF_7$ as the additive gas and 87 vol % of Ar as the inert gas. The etching performance was the evaluated in the same manner as in Example 1.

Example 5

The etching operation was performed under the same conditions as in Example 1, except that the dry etching agent used contained 10 vol % of $C_3H_2F_4$ (HFO-1234ze(E)) as the fluorocarbon, 4 vol % of $IF_7$ as the additive gas and 86 vol % of Ar as the inert gas. The etching performance was the evaluated in the same manner as in Example 1.

Example 6

The etching operation was performed under the same conditions as in Example 1, except that the dry etching agent used contained 10 vol % of $C_3H_2F_4$ (HFO-1234ze(E)) as the fluorocarbon, 5 vol % of $IF_7$ as the additive gas and 85 vol % of Ar as the inert gas. The etching performance was the evaluated in the same manner as in Example 1.

Example 7

The etching operation was performed under the same conditions as in Example 1, except that the dry etching agent used contained 10 vol % of $C_3HF_3$ (3,3,3-trifluoropropyne) as the fluorocarbon, 3 vol % of $IF_7$ as the additive gas and 87 vol % of Ar as the inert gas. The etching performance was the evaluated in the same manner as in Example 1.

Example 8

The etching operation was performed under the same conditions as in Example 1, except that the dry etching agent used contained 10 vol % of $C_3HF_3$ (3,3,3-trifluoropropyne) as the fluorocarbon, 4 vol % of $IF_7$ as the additive gas and 86 vol % of Ar as the inert gas. The etching performance was the evaluated in the same manner as in Example 1.

Example 9

The etching operation was performed under the same conditions as in Example 1, except that the dry etching agent used contained 10 vol % of $C_3HF_3$ (3,3,3-trifluoropropyne) as the fluorocarbon, 5 vol % of $IF_7$ as the additive gas and 85 vol % of Ar as the inert gas. The etching performance was the evaluated in the same manner as in Example 1.

Example 10

The etching operation was performed under the same conditions as in Example 1, except that the dry etching agent used contained 10 vol % of $C_3HF_3$ (3,3,3-trifluoropropyne) as the fluorocarbon, 8 vol % of $IF_7$ as the additive gas and 82 vol % of Ar as the inert gas. The etching performance was the evaluated in the same manner as in Example 1.

Comparative Example 1

The etching operation was performed under the same conditions as in Example 1, except that the dry etching agent used contained 10 vol % of $C_3H_2F_4$ (HFO-1234ze(E)) as the fluorocarbon, 0.5 vol % of $IF_7$ as the additive gas and 89.5 vol % of Ar as the inert gas. The etching performance was the evaluated in the same manner as in Example 1.

Comparative Example 2

The etching operation was performed under the same conditions as in Example 1, except that the dry etching agent used contained 10 vol % of $C_3H_2F_4$ (HFO-1234ze(E)) as the fluorocarbon, 11 vol % of $IF_7$ as the additive gas and 79 vol % of Ar as the inert gas. The etching performance was the evaluated in the same manner as in Example 1.

Comparative Example 3

The etching operation was performed under the same conditions as in Example 1, except that: the dry etching agent used contained 10 vol % of $CF_4$ as the fluorocarbon, 3 vol % of $IF_7$ as the additive gas and 87 vol % of Ar as the inert gas; and the pressure inside the chamber was set to 5 Pa. The etching performance was the evaluated in the same manner as in Example 1.

Comparative Example 4

The etching operation was performed under the same conditions as in Example 1, except that the dry etching agent used contained 10 vol % of $C_3F_8$ as the fluorocarbon, 4 vol % of $IF_7$ as the additive gas and 86 vol % of Ar as the inert gas. The etching performance was the evaluated in the same manner as in Example 1.

Comparative Example 5

The etching operation was performed under the same conditions as in Example 1, except that the dry etching agent used contained 10 vol % of $C_3H_2F_4$ (HFO-1234ze(E)) as the fluorocarbon, 3 vol % of $ClF_3$ (chlorine trifluoride) as the additive gas and 87 vol % of Ar as the inert gas. The etching performance was the evaluated in the same manner as in Example 1.

Comparative Example 6

The etching operation was performed under the same conditions as in Example 1, except that the dry etching agent used contained 10 vol % of $C_3H_2F_4$ (HFO-1234ze(E)) as the fluorocarbon, 3 vol % of $IF_5$ (iodine pentafluoride) as the additive gas and 87 vol % of Ar as the inert gas. The etching performance was the evaluated in the same manner as in Example 1.

The etching test results of Examples 1 to 10 and Comparative Examples 1 to 6 are shown in TABLE 1. In TABLE 1, the etching rate ratio refers to the ratio of the etching rate of p-Si to the etching rate of $SiO_2$; and the hole diameter ratio "lower than 30%" means that the hole diameter ratio was lower than 30% at the maximum.

TABLE 1

| | Dry etching agent | | | | | |
|---|---|---|---|---|---|---|
| | Fluorocarbon | | Additive gas | | Inert gas | |
| | Molecular formula | Concentration vol % | Molecular formula | Concentration vol % | Molecular formula | Concentration vol % |
| Example 1 | $C_3HF_5$ | 10 | $IF_7$ | 1 | Ar | 89 |
| Example 2 | $C_3HF_5$ | 10 | $IF_7$ | 2 | Ar | 88 |
| Example 3 | $C_3H_2F_4$ | 10 | $IF_7$ | 2 | Ar | 88 |
| Example 4 | $C_3H_2F_4$ | 10 | $IF_7$ | 3 | Ar | 87 |
| Example 5 | $C_3H_2F_4$ | 10 | $IF_7$ | 4 | Ar | 86 |
| Example 6 | $C_3H_2F_4$ | 10 | $IF_7$ | 5 | Ar | 85 |
| Example 7 | $C_3HF_3$ | 10 | $IF_7$ | 3 | Ar | 87 |
| Example 8 | $C_3HF_3$ | 10 | $IF_7$ | 4 | Ar | 86 |
| Example 9 | $C_3HF_3$ | 10 | $IF_7$ | 5 | Ar | 85 |
| Example 10 | $C_3HF_3$ | 10 | $IF_7$ | 8 | Ar | 82 |
| Comparative Example 1 | $C_3H_2F_4$ | 10 | $IF_7$ | 0.5 | Ar | 89.5 |
| Comparative Example 2 | $C_3H_2F_4$ | 10 | $IF_7$ | 11 | Ar | 79 |
| Comparative Example 3 | $CF_4$ | 10 | $IF_7$ | 3 | Ar | 87 |
| Comparative Example 4 | $C_3F_8$ | 10 | $IF_7$ | 4 | Ar | 86 |
| Comparative Example 5 | $C_3H_2F_4$ | 10 | $ClF_3$ | 3 | Ar | 87 |
| Comparative Example 6 | $C_3H_2F_4$ | 10 | $IF_5$ | 3 | Ar | 87 |

| | Pressure Pa | Power supplied W/cm$^2$ | Bias voltage V | $SiO_2$ etching rate nm/min | p-Si etching rate nm/min | Etching rate ratio % | Hole diameter ratio % |
|---|---|---|---|---|---|---|---|
| Example 1 | 1 | 1.0 | 500 | 76 | 62 | 81 | Lower than 30 |
| Example 2 | 1 | 1.0 | 500 | 75 | 65 | 86 | Lower than 30 |
| Example 3 | 1 | 1.0 | 500 | 79 | 66 | 84 | Lower than 30 |
| Example 4 | 1 | 1.0 | 500 | 83 | 75 | 90 | Lower than 30 |

TABLE 1-continued

| | | | | | | | |
|---|---|---|---|---|---|---|---|
| Example 5 | 1 | 1.0 | 500 | 86 | 93 | 108 | Lower than 30 |
| Example 6 | 1 | 1.0 | 500 | 90 | 107 | 119 | Lower than 30 |
| Example 7 | 1 | 1.0 | 500 | 79 | 72 | 91 | Lower than 30 |
| Example 8 | 1 | 1.0 | 500 | 80 | 81 | 101 | Lower than 30 |
| Example 9 | 1 | 1.0 | 500 | 84 | 91 | 108 | Lower than 30 |
| Example 10 | 1 | 1.0 | 500 | 82 | 121 | 147 | Lower than 30 |
| Comparative Example 1 | 1 | 1.0 | 500 | 24 | 14 | 58 | Lower than 30 |
| Comparative Example 2 | 1 | 1.0 | 500 | 89 | 258 | 290 | Lower than 30 |
| Comparative Example 3 | 5 | 1.0 | 400 | 120 | 236 | 197 | 40 |
| Comparative Example 4 | 1 | 1.0 | 500 | 109 | 227 | 208 | Lower than 30 |
| Comparative Example 5 | 1 | 1.0 | 500 | 2 | 1 | 50 | Lower than 30 |
| Comparative Example 6 | 1 | 1.0 | 500 | — | — | — | — |

In Examples 1 to 10 where both of the unsaturated hydrofluorocarbon $C_3H_xF_y$ and the iodine heptafluoride were contained in the dry etching agent, the etching rate ratio was in the range of 67 to 150%; and the hole diameter ratio was lower than 30% as shown in TABLE 1. In particular, the etching rate ratio was in the range of 80 to 120% so that the etching rate of p-Si and the etching rate of $SiO_2$ were more equal to each other in Examples of 1 to 9 where the volume of the iodine heptafluoride in the dry etching agent was 0.1 to 0.5 times the volume of the unsaturated hydrofluorocarbon $C_3H_xF_y$ in the dry etching agent. It is apparent from these results that, by applying each of the dry etching agents of Examples 1 to 10 to a laminate film of p-Si and $SiO_x$ layers, it is possible to a through hole in the laminated film in one etching operation.

By contrast, both of the etching rate of p-Si and the etching rate of $SiO_2$ were not sufficient in Comparative Example 1 where the mixing ratio of the unsaturated hydrofluorocarbon $C_3H_xF_y$ and the iodine heptafluoride was 1:0.05 in terms of volume ratio. In Comparative Example 2 where the mixing ratio of the unsaturated hydrofluorocarbon $C_3H_xF_y$ and the iodine heptafluoride was 1:1.1 in terms of volume ratio, the etching rate ratio was too high due to too high etching rate of p-Si.

Figure 4:
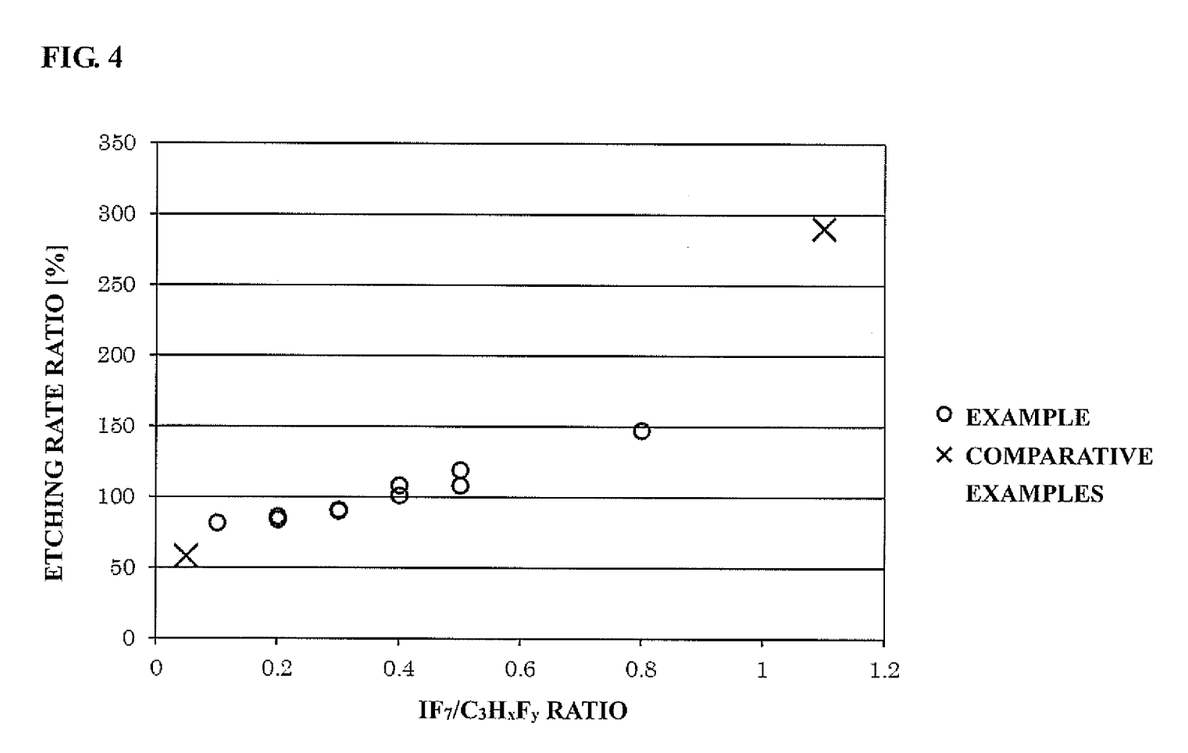
FIG. 4 is a graph showing test results of Examples and Comparative Examples.

As shown in FIG. 4, the etching rate ratio was 67 to 150% in the range where the volume ratio of the unsaturated hydrofluorocarbon $C_3H_xF_y$ and the iodine heptafluoride was 1:0.1 to 1:1 (i.e. the volume of the iodine heptafluoride in the dry etching agent is 0.1 to 1.0 times the volume of the unsaturated hydrofluorocarbon in the dry etching agent). It would be possible to achieve equal-rate etching of p-Si and $SiO_x$ by controlling the volume ratio of the unsaturated hydrofluorocarbon $C_3H_xF_y$ and the iodine heptafluoride to within the above range.

In Comparative Example 3 where the saturated perfluorocarbon $CF_4$ was contained as the fluorocarbon in the dry etching agent; and the bias voltage applied was low, the etching rate ratio was too high; and the hole diameter ratio was increased to 40% at the maximum due to the occurrence of side etching. In Comparative Example 4 where the saturated perfluorocarbon $C_3F_8$ was contained as the fluorocarbon in the dry etching agent, the etching rate ratio was too high due to too high etching rate of p-Si. In Comparative Example 5 where $ClF_3$ was contained as the additive gas in the dry etching agent, there occurred almost no etching of both p-Si and $SiO_2$ due to insufficient oxidization and decomposition of the unsaturated hydrofluorocarbon ($C_3H_2F_4$) and low reactivity of $ClF_3$ to p-Si. As compared to Example 4 where $IF_7$ was contained as the additive gas in the dry etching agent, the oxidization and decomposition of the unsaturated hydrofluorocarbon ($C_3H_2F_4$) did not proceed sufficiently in Comparative Example 6 where $IF_5$ was contained as the additive gas in the dry etching agent. As a result, there occurred a deposit coating of probably fluorocarbon polymer, without etching of both p-Si and $SiO_2$, in Comparative Example 6. As mentioned above, Example 4 and Comparative Examples 5 and 6 were different from one another only in the kind of the additive gas ($IF_7$, $ClF_3$ and $IF_5$ were used as the additive gas in Example 4 and Comparative Examples 5 and 6, respectively). It is apparent from comparison of these results that the use of $IF_7$ rather than any other additive gas leads to sufficient simultaneous etching of p-Si and $SiO_x$.

The entire contents of Japanese Patent Application No. 2015-011725 (filed on Jan. 23, 2015) and No. 2015-226219 (filed on Nov. 19, 2015) are herein incorporated by reference.

INDUSTRIAL APPLICABILITY

The present invention is useful for the formation of interconnection in three-dimensional integrated devices in a semiconductor manufacturing process.

What is claimed is:

1. A dry etching method for a laminated film, the laminated film comprising at least one silicon layer and at least one silicon oxide layer laminated together, the dry etching method comprising:
   applying a mask with an opening to the laminated film;
   generating a plasma gas from a dry etching agent;
   bringing the plasma gas into contact with the laminated film through the opening of the mask; and
   etching the laminated film with the plasma gas under the application of a bias voltage, thereby forming a through hole in the laminated film in a direction perpendicular to an in-plane direction of the laminated film,
   wherein the dry etching agent comprises:
   an unsaturated hydrofluorocarbon represented by the following formula: $C_3H_xF_y$ where x is an integer of 1 to 5; y is an integer of 1 to 5; and x and y satisfy a relationship of x+y=4 or 6; and
   iodine heptafluoride, wherein the volume of the iodine heptafluoride in the dry etching agent is 0.1 to 1.0 times the volume of the unsaturated hydrofluorocarbon in the dry etching agent.

2. The dry etching method according to claim 1, wherein the unsaturated hydrofluorocarbon is at least one selected from the group consisting of $C_3HF_5$, $C_3H_2F_4$ and $C_3HF_3$.

3. The dry etching method according to claim 1, wherein the bias voltage is 500 V or higher.

4. The dry etching method according to claim 1, wherein the dry etching agent further comprises an inert gas, and wherein the total amount of the unsaturated hydrofluorocarbon and the iodine heptafluoride in the dry etching agent is 2 to 95 vol %.

5. The dry etching method according to claim 4, wherein the dry etching agent essentially consists of the unsaturated hydrofluorocarbon, the iodine heptafluoride and the inert gas.

6. The dry etching method according to claim 1, wherein the concentration of the unsaturated hydrofluorocarbon in the dry etching agent is 1 to 90 vol %.

7. The dry etching method according to claim 6, wherein the concentration of the unsaturated hydrofluorocarbon in the dry etching agent is 10 to 50 vol %.

8. The dry etching method according to claim 1, wherein the laminated film comprises a plurality of silicon layers and a plurality of silicon oxide layers alternately laminated together.

9. The dry etching method according to claim 1, wherein the ratio of an etching rate of the silicon layer to an etching rate of the silicon oxide layer is in a range of 67 to 150%.

10. The dry etching method according to claim 1, wherein the through hole is formed with a hole diameter ratio of 30% or lower as determined by the following equation:

$$\text{Hole diameter ratio} = \frac{\text{Diameter of through hole in laminated film}}{\text{Diameter of opening mask}} \times 100\%.$$

* * * * *